United States Patent
Carlson et al.

(10) Patent No.: US 7,265,579 B2
(45) Date of Patent: *Sep. 4, 2007

(54) FIELD PROGRAMMABLE GATE ARRAY INCORPORATING DEDICATED MEMORY STACKS

(75) Inventors: Randolph Stuart Carlson, Carson City, NV (US); Volkan Ozguz, Aliso Viejo, CA (US); Keith D. Gann, Tustin, CA (US); John P. Leon, Anaheim, CA (US)

(73) Assignee: Irvine Sensors Corp., Costa Mesa, CA (US)

( * ) Notice: Subject to any disclaimer, the term of this patent is extended or adjusted under 35 U.S.C. 154(b) by 27 days.

This patent is subject to a terminal disclaimer.

(21) Appl. No.: 11/037,490

(22) Filed: Jan. 18, 2005

(65) Prior Publication Data

US 2005/0122758 A1    Jun. 9, 2005

Related U.S. Application Data

(63) Continuation of application No. 10/347,038, filed on Jan. 17, 2003, now Pat. No. 6,856,167.

(60) Provisional application No. 60/384,582, filed on May 31, 2002.

(51) Int. Cl.
   *H03K 19/177*    (2006.01)
(52) U.S. Cl. .......................................... 326/41; 326/40
(58) Field of Classification Search ................ 326/41, 326/38, 82
   See application file for complete search history.

(56) References Cited

U.S. PATENT DOCUMENTS

| 6,526,559 B2* | 2/2003 | Schiefele et al. | 326/41 |
| 6,856,167 B2* | 2/2005 | Ozguz et al. | 326/41 |

* cited by examiner

*Primary Examiner*—Lam T. Mai
(74) *Attorney, Agent, or Firm*—W. Eric Boyd, Esq.

(57) ABSTRACT

A field programmable gate array, an access lead network coupled to the FPGA, and a plurality of memories electrically coupled to the access lead network. The FPGA, access lead network, and plurality of memories are arranged and configured to operate with a variable word width, namely with a word width between 1 and a maximum number of bits. The absolute maximum word width may be as large as m.times.N where m is the number of word width bits per memory chip and N is the number of memory chips.

4 Claims, 5 Drawing Sheets

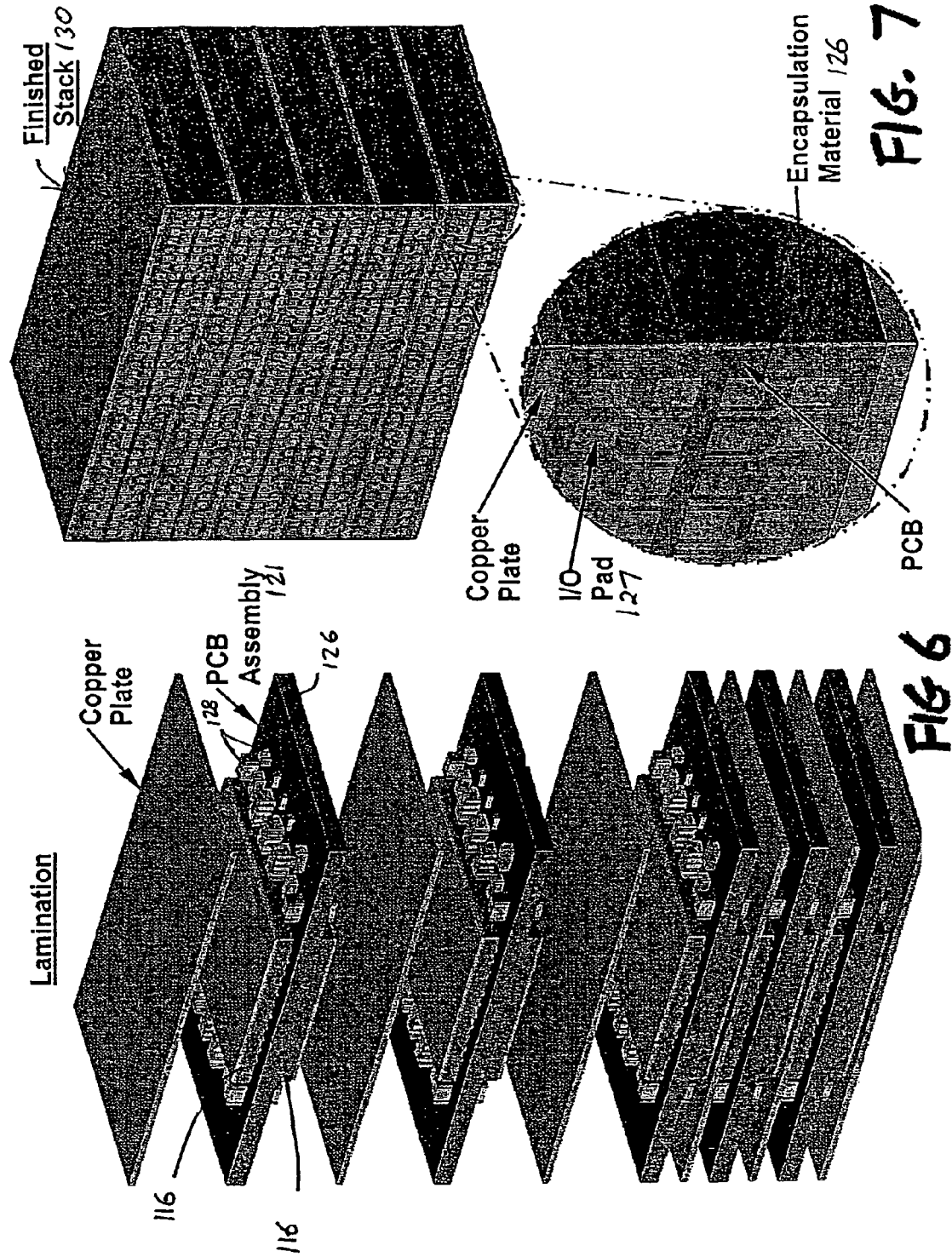

FIELD PROGRAMMABLE GATE ARRAY INCORPORATING DEDICATED MEMORY STACKS

RELATED APPLICATIONS

The present application is a continuation application of U.S. patent application Ser. No. 10/347,038, "Field Programmable Gate Array With A Variably Wide Word Width Memory", filed Jan. 17, 2003, now U.S. Pat. No. 6,856,167, which in turn is related to U.S. Provisional Patent Application Ser. No. 60/384,582, filed on May 31, 2002, which is incorporated herein by reference and to which priority is claimed pursuant to 35 USC 119.

BACKGROUND OF THE INVENTION

1. Field of the Invention

The invention relates to an electronic module and in particular to a combination of a memory array with a field programmable gate array.

2. Description of the Prior Art

Of the many varieties of integrated circuits available on the market today, field programmable gate arrays (FPGAs) are particularly useful when building many kinds of electronic devices and systems. Because FPGAs allow the designer to integrate complex logic that is peculiar to his application in one or perhaps a few integrated circuits without suffering the cost, delay and risk that typically are incurred when designing a custom integrated circuit, use of FPGAs greatly reduce both design cost and time-to-market for new products.

Not withstanding the great utility of FPGAs, there exist several limitations to the usefulness of these devices. As suggested by FIG. 1, one of the limitations is that FPGAs are typically designed based on a design rule that assumes a fixed and limited word width which is particularly limiting when used in combination with a large amount of memory in high performance applications such as data processing and networking. Further, when the FPGA is used to read from and write into a memory array that is arranged in a typical planar fashion, a considerable amount of space on the printed circuit board is required in order to physically provide for the combination of the FPGA and the memory. Even when space is available for a large planar area that supports the FPGA and surrounding memory, large areas inherently increase parasitics and degrade performance.

What is needed is some type of packaging concept for an FPGA and associated memory array which overcomes these limitations in the prior art.

BRIEF SUMMARY OF THE INVENTION

The invention is embodied by a field programmable gate array, an access lead network coupled to the FPGA, and a plurality of memories electrically coupled to the access lead network. The FPGA, access lead network, and plurality of memories are arranged and configured to operate with a variable word width, namely with a word width between 1 and a maximum number of bits. The absolute maximum word width may be as large as m.times.N where m is the number of word width bits per memory chip and N is the number of memory chips.

A first preferred embodiment of the invention is an apparatus comprising a field programmable gate array (FPGA), an access lead network formed from an interposer board electrically coupled and proximate to the FPGA, and a plurality of memories electrically coupled and proximate to the interposer board on an opposite side thereof to the FPGA.

The FPGA is coupled to the interposer board through a first ball grid array. The plurality of memories are coupled to the interposer board through a second ball grid array. The plurality of memories are preferably stacked to collectively form a memory block having an upper and lower contact surface and where the second ball grid array is disposed on both the upper and lower contact surfaces. Whether the ball grid arrays are disposed on the memory block, the interposer board or the FPGA is a matter of choice and convenience. Hence, although it may later be stated, for example, that the first ball array is disposed on the interposer board, it is equivalent to state that the first ball array is disposed on the FPGA or both. For the purposes of this specification any statement that a ball grid array is disposed on one of two adjacent structures should be understood as meaning that the ball grid array is disposed on the other one of the two adjacent structures or both.

The apparatus further comprises a plurality of interleaved lines. The portion of the second ball grid array on the upper contact surface is directly coupled to the interposer board and where the portion of the second ball grid array on the lower contact surface is coupled to the interposer board through the plurality of interleaved lines.

The apparatus further comprises an insulatively filled layer disposed between adjacent ones of the plurality of memories in which layer the interleaved lines are disposed.

The apparatus further comprises at least one resistor and capacitor combination coupled to a corresponding one of the plurality of memories, the resistor and capacitor combination being disposed in the insulatively filled layer.

It is to be expressly understood that the invention also includes the method of fabricating the apparatus disclosed above.

A second preferred embodiment of the invention is an apparatus comprising a field programmable gate array (FPGA), an access lead network formed from an interposer board electrically coupled and proximate to the FPGA, and a plurality of memories electrically coupled and proximate to the interposer board on the same side thereof as the FPGA.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 6 is an exploded perspective view of a memory stack used in the memory enhanced gate array of FIG. 5.

FIG. 7 is a perspective view and close-up enlargement of a memory enhanced gate array of FIG. 5.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
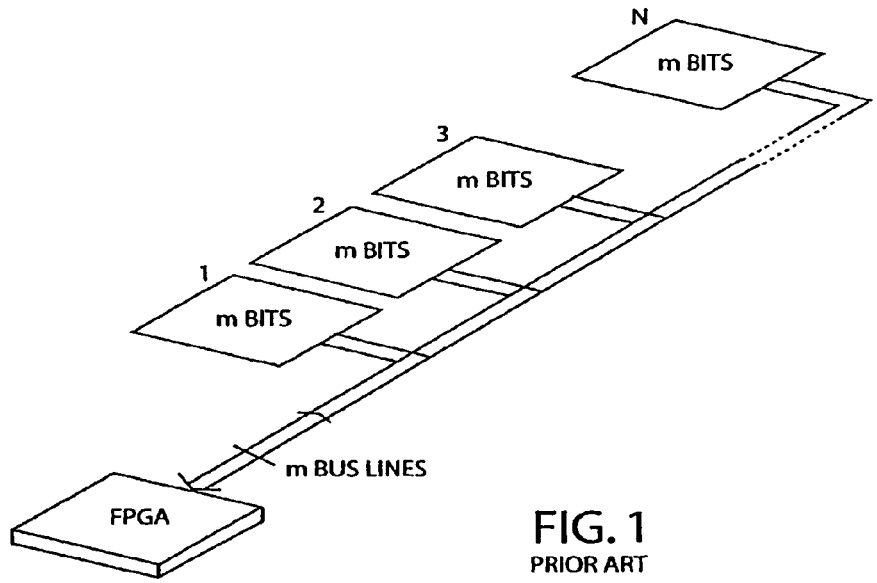
FIG. 1 is a simplified schematic view of a conventional bused interface between an FPGA and a planar-arranged memory array where the word width is fixed and limited to a physical bus width of only m-bits.
Figure 2:
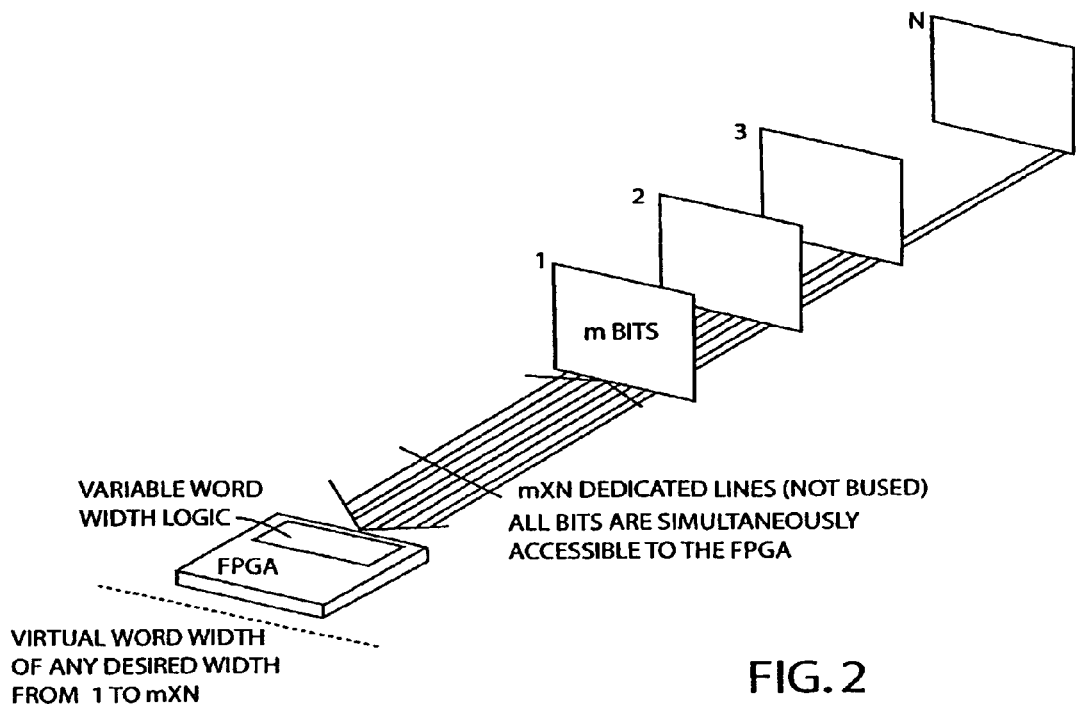
FIG. 2 is an simplified schematic view of a memory enhanced gate array according to a generalized embodiment of this invention where all memory bits are simultaneously available to the FPGA such that the FPGA, incorporating suitable logic, can implement a virtual word with of any desired width from 1 to m.times.N bits.

FIG. 2 is an simplified schematic view of a memory enhanced gate array according to a generalized embodiment of this invention a field programmable gate array (FPGA) has simultaneous access to all memory bits such that the FPGA, incorporating suitable logic, can implement a virtual word with of any desired width from 1 to m.times.N bits. Various particular embodiments are possible, two of which will now be discussed.

Figure 3:
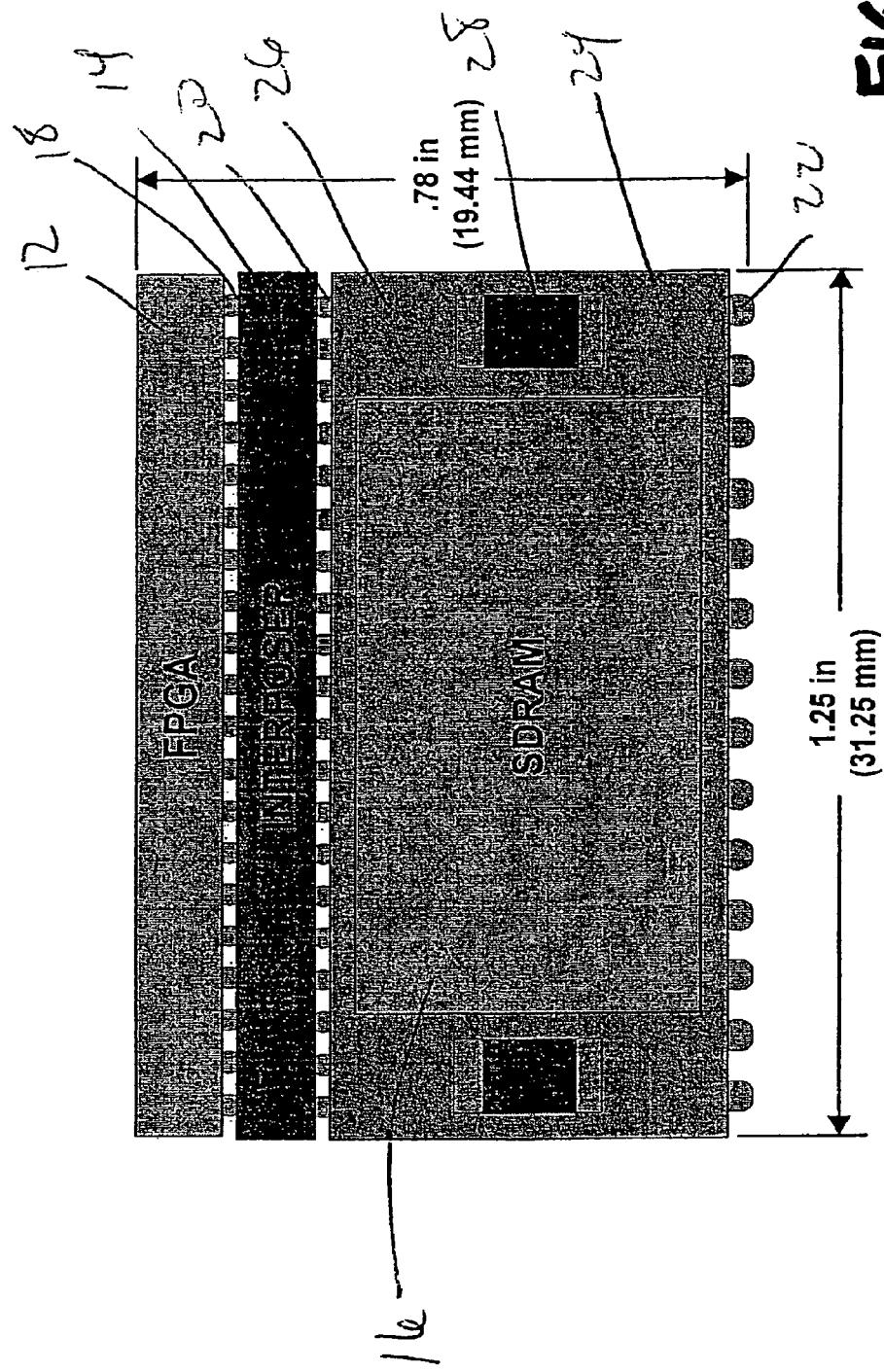
FIG. 3 is a diagrammatic end view of a memory enhanced gate array according to a first preferred embodiment of the invention.
Figure 4:
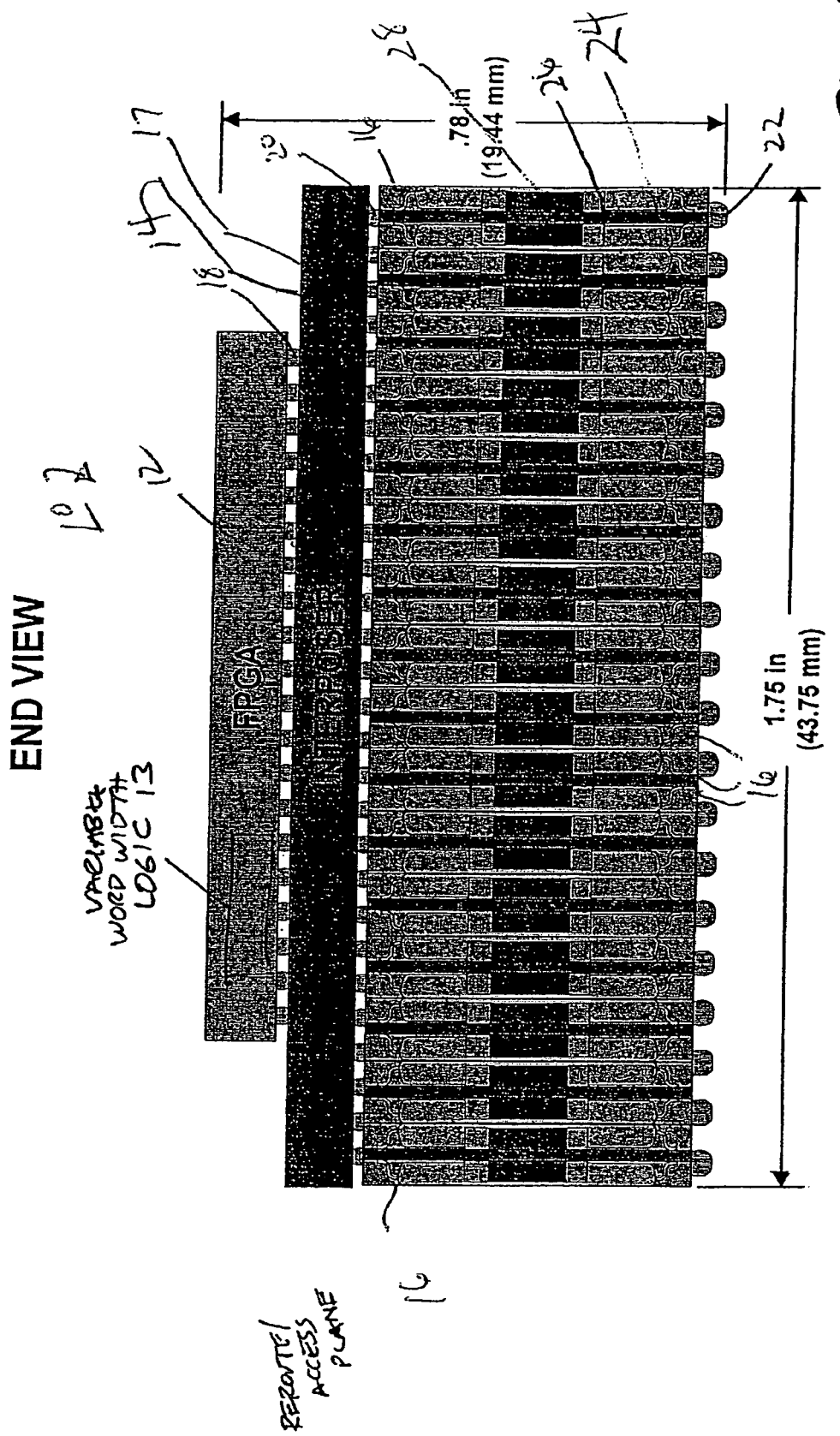
FIG. 4 is a diagrammatic side view of the memory enhanced gate array of FIG. 3.

FIGS. 3 and 4 relate to a first preferred embodiment where an FPGA is coupled to an access lead network formed, in this particular case, by a proximate interposer board and a first ball grid array. A plurality of memories are coupled to the proximate interposer board through a second ball grid array. As discussed above, the FPGA operates with a variable word width. The plurality of memories are stacked to form a memory block. Each individual access lead to the memory in each layer of the memory stack is brought to the edge of the stack. Therefore, the FPGA can connect to a large memory array at any desired word width from 1 to m.times.N, i.e. from 1 to the maximum number of bits in the memory array. The second ball grid array is disposed on both the upper and lower contact surfaces of the memory block. The portion of the second ball grid array on the upper contact surface is directly coupled to the interposer board. The portion of the second ball grid array on the lower contact surface is coupled to the interposer board through a plurality of interleaved lines. An insulatively filled layer is disposed between adjacent ones of the plurality of memories in which layer the interleaved lines are disposed.

The first preferred memory enhanced gate array 10 is illustrated in a diagrammatic assembled end view in FIG. 3 and in a diagrammatic assembled side view in FIG. 4. The memory enhanced gate array 10 is fabricated using a stacked architecture such as that developed by Irvine Sensors and generally described in Irvine Sensors issued patents. Stacked architectures are characterized by high port density and low power consumption. As shown in FIGS. 3 and 4 a field programmable gate array (FPGA) 12 is disposed on a first side of an interposer board 14 through a conventional ball grid array 18 connection therebetween. Any FPGA now available or later devised may be used.

In this particular embodiment, the Interposer board 14 that forms the access lead network is an insulating printed circuit board having a first surface (the topside in the picture) with a contact pattern arranged and configured to connect to the ball grid array 18 of FPGA 12 and having a plurality of vias 17 defined therethrough connecting ball grid array 18 with a contact pattern arranged and configured to connect to the ball grid array 20 on a second surface (the underside in the picture).

Disposed adjacent the second side of the interposer 14 in an edgewise fashion are a plurality of memory integrated circuits 16. Memory integrated circuits 16 are organized in a "loaf fashion", that is each circuit 16 is thought of as a "slice of bread" stacked together to collectively form a "loaf" with a first side of the loaf in contact with interposer board 14. Greater detail concerning the "loaf" architecture is disclosed in U.S. patent application Ser. No. 09/339,023, filed on Jan. 9, 2003, and entitled "METHOD FOR MAKING STACKED INTEGRATED CIRCUITS (ICs) USING PREPACKAGED PARTS", which is incorporated herein by reference. In the illustrated embodiment, the memory integrated circuits 16 are synchronous dynamic random access memories (SDRAMs).

The leads of memory integrated circuits 16 are connected directly to ball grid array 20 in the case of the leads exiting memory integrated circuits 16 on first ends of memory integrated circuits 16 near interposer board 14 and through interleaved lines 24 between memory integrated circuits 16 in the case of leads on the lower ends of memory integrated circuits 16 disposed away from interposer board 14. The interleaved lines 24 are connected to ball grid array 22 on a second surface (the bottom as shown) of memory enhanced gate array 10 which in turn are coupled to the leads of memory integrated circuits 16 disposed away from interposer board 14. Interleaved lines 24 are then led upward through an insulatively filled layer 26 and connected into ball grid array 20 next to the upper ends of integrated circuits 16 adjacent to interposer board 14. Also included in layer 26 is a conventional discrete or integrated circuit resistor and capacitor combination 28 coupled in a conventional manner with integrated circuits 16 to optimize memory speed.

An FPGA 12 used in connection with this invention may be arranged and configured as disclosed in U.S. patent application Ser. No. 09/346,363, filed on Jan. 17, 2003, entitled "METHOD FOR EFFECTIVELY EMBEDDING VARIOUS INTEGRATED CIRCUITS WITHIN FIELD FROGRAMMABLE GATE ARRAYS", which is incorporated herein by reference. As there disclosed, FPGA 12 operates with a parameterized word width which can be configured or field programmed as suggested by block 13 labeled "variable word with logic." Hence, in the illustrated embodiment, the memory block of memory enhanced gate array 10 operates so that the memory is addressable in word widths of 1 to m.times.N bits.

It is a further advantage of the invention that FPGA 12 and more importantly, its leads are in very close proximity to the addressable leads of memories 16, thereby avoiding a host of timing and capacitance problems that can arise when the FPGA and the memory array are separated by substantially longer line lengths as occurs on a conventional flat or planar printed circuit board layout.

There is no bus-width related processor-to-memory bottleneck with the architecture of the invention and there is negligible response skew as compared with a hypothetical, simultaneous connection to multiple memory chips arranged on a planar substrate. In a conventional bussed and planar arrangement of memory, the maximum transfer rate is m bits multiplied by the clock speed. In a memory enhanced gate array according to this invention, however, the maximum transfer rate is m.times.N bits times the clock rate. Skew is minimized because the equal lead length topology associated with the embodiments of this invention makes it unnecessary to account for different response times to differently located memory circuits.

Figure 5:
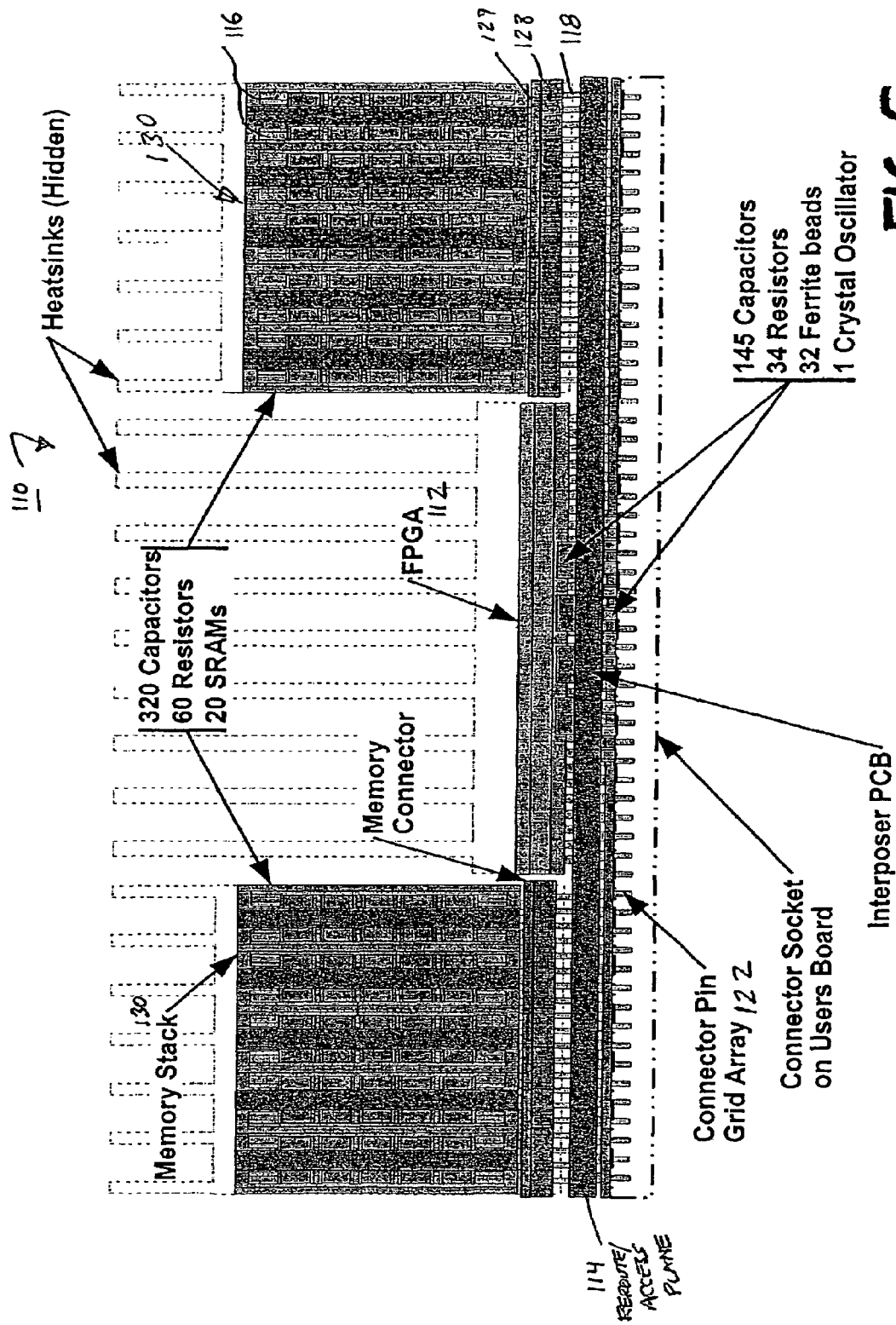
FIG. 5 is a diagrammatic end view of a memory enhanced gate array according to a second preferred embodiment of the invention.

Further the invention is characterized by "virtual" memory modularity and a hidden memory-to-pin configuration. The virtual memory modularity arises from the fact that the invention permits m.times.N bits of memory to be accessed in any desired word with from 1 bit to m.times.N bits. By way of example, sixteen 1 GB memory chips that are 18 bits wide could be addressed as any one of the following configurations, and more:

1 GB memory with 18.times.16 word width
2 GB memory with 18.times.8 word width
4 GB memory with 18.times.4 word width
16 GB memory with 18.times.1 word width FIGS. 5 to 7 illustrate a memory enhanced gate array 110 according to a second preferred embodiment of the invention. The embodiment is still an apparatus comprising a field programmable gate array (FPGA) 112, an access lead network formed from an interposer board 114 electrically coupled and proximate to the FPGA, and a plurality of memory electronic integrated circuits 116 that electrically coupled and proximate to the interposer board. There are, however, certain implementation differences.

For example, the memory ICs 116 are ball grid array (BGA) packages and they are connected (through a printed circuit board 121 and a connector 128) to the same side of the interposer board 114 as the FPGA 112. As better shown in FIG. 6, the second embodiment 110 features PCB Assemblies 121 where the memory ICs 116 are mounted to opposite sides of the printed circuit board 126 with resistors and capacitors 128 as required. As suggested by FIG. 6, the PCB assemblies 121 are suitably arranged to form an overall memory stack 130. Two such stacks 130, 130 are disposed on either side of the FPGA 112 as shown in FIG. 5, but fewer or more stacks may be used.

As shown in FIG. 7, the memory stacks 130 are complete by introducing an encapsulation material 126 between the layers of the stack, and then using suitable metallization techniques to form I/O pads 127 on the resulting planar edge of the stack 130. The I/O pads 127 of the finished stack are ultimately mated to a connector 128 using conventional BGA connectors 129 as shown in FIG. 5.

Another difference between the first and second embodiments is that in the second embodiment, as shown in FIG. 5, the memory stacks 130 are connected to the interposer board 114 with a pin grid array 118 rather than directly to the interposer with a ball grid array. The overall memory enhanced gate array 110 is also connected to a user board with a pin grid array 122 rather than with a ball grid array. The foregoing electromechanical interconnection between the FPGA, the memories and the user board are just two examples and any desired method of interconnection may be used.

It is possible, of course, to couple the plurality of memories to the FPGA at a die level, using suitable metallization techniques, rather than using a discrete interposer board as in the first two embodiments.

Many other alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

We claim:

1. An apparatus comprising:
   a field programmable gate array (FPGA);
   an access lead network electrically coupled and proximate to the FPGA;
   at least one memory stack external of said FPGA and electrically coupled to an interposer board, said memory stack defining at least one planar edge and comprised of a plurality of layers wherein each of said layers comprises at least one memory IC; and,
   said memory stack further comprising at least one conductive I/O pad on said at least one planar edge for the routing of an electrical signal between said at least one memory IC and said interposer board.

2. The apparatus of claim 1 where the FPGA is arranged and configured to operate with a variable word width.

3. The apparatus of claim 1 where the access lead network is an interposer board.

4. The apparatus of claim 2 where the FPGA is arranged and configured to operate with a word width between 1 to m.times.N bits where m is the number of bits in the word width of each of said memory ICs and N is the number of said memory ICs in said stack.

* * * * *

UNITED STATES PATENT AND TRADEMARK OFFICE
CERTIFICATE OF CORRECTION

| | | |
|---|---|---|
| PATENT NO. | : 7,265,579 B2 | Page 1 of 1 |
| APPLICATION NO. | : 11/037490 | |
| DATED | : September 4, 2007 | |
| INVENTOR(S) | : Randolph Stuart Carlson et al. | |

It is certified that error appears in the above-identified patent and that said Letters Patent is hereby corrected as shown below:

ON THE TITLE PAGE:

(60) "Provisional application No. 60/384,582, filed on May 31, 2002", should read --Provisional application No. 60/348,852, filed on Jan. 17, 2002--.

Column 1, Line 12: "Ser. No. 60/384,582, filed on May 31, 2002", should read --Ser. No. 60/348,852, filed on Jan. 17, 2002--.

Signed and Sealed this

Fifth Day of January, 2010

David J. Kappos
*Director of the United States Patent and Trademark Office*